(12) United States Patent
Schuler

(10) Patent No.: US 7,737,798 B2
(45) Date of Patent: Jun. 15, 2010

(54) SYSTEMS AND METHODS FOR MULTI-RANGE CLOCK GENERATION

(75) Inventor: John A. Schuler, Blaine, MN (US)

(73) Assignee: Agere Systems Inc., Allentown, PA (US)

( * ) Notice: Subject to any disclaimer, the term of this patent is extended or adjusted under 35 U.S.C. 154(b) by 216 days.

(21) Appl. No.: 11/435,810

(22) Filed: May 16, 2006

(65) Prior Publication Data

US 2007/0268083 A1 Nov. 22, 2007

(51) Int. Cl.
*H03L 7/093* (2006.01)
(52) U.S. Cl. .................. 331/179; 331/177 R; 331/16; 331/34
(58) Field of Classification Search ............... 331/36 C, 331/179, 177 R, 16, 34, 57
See application file for complete search history.

(56) References Cited

U.S. PATENT DOCUMENTS

| | | | | |
|---|---|---|---|---|
| 4,510,461 A | * | 4/1985 | Dickes et al. ............... | 331/1 A |
| 6,188,285 B1 | * | 2/2001 | Nakanishi et al. ............... | 331/2 |
| 6,356,158 B1 | * | 3/2002 | Lesea ............... | 331/11 |
| 6,885,873 B2 | * | 4/2005 | Ravi et al. ............... | 455/517 |
| 6,940,356 B2 | * | 9/2005 | McDonald et al. ............... | 331/16 |

* cited by examiner

*Primary Examiner*—Robert Pascal
*Assistant Examiner*—James E Goodley
(74) *Attorney, Agent, or Firm*—Hamilton, DeSanctis & Cha

(57) ABSTRACT

Various systems and methods for clock generation are disclosed herein. As just one example, a system for clock generation is disclosed that includes a phase/frequency control circuit that provides a feedback control; a multi-range selector circuit that receives the feedback control; and a controlled oscillator that provides an output with a phase and frequency at least in part governed by the multi-range selector circuit and the feedback control. In various instances of the aforementioned embodiments, the controlled oscillator is a ring oscillator relying on inherent capacitance.

23 Claims, 5 Drawing Sheets

SYSTEMS AND METHODS FOR MULTI-RANGE CLOCK GENERATION

BACKGROUND OF THE INVENTION

The present invention is related to systems and methods for synchronizing a semiconductor device, and more particularly to systems and methods for generating a clock signal.

Semiconductor devices often rely on a clock signal to synchronize operation of circuitry implemented within the device. In some cases, such clock signals are provided external to the device, while in other cases they are generated as part of the circuitry of the semiconductor device. Various approaches have been utilized for such internal clock generation including phase lock loops using a reference signal and driving a voltage controlled oscillator. In general, such clock generation circuitry function over limited ranges. Such a limited range of operation is often acceptable for a particular design, but in some cases a greater range of operation is desired.

As an example, one existing voltage controlled oscillator 100 utilizing a preset current and discrete capacitor to set the oscillation frequency is depicted in FIG. 1. Voltage controlled oscillator 100 includes a series of two PFET transistors 102, 104 and NFET transistors 106, 108 that operate as a current mirror either sinking or sourcing current to/from a discrete capacitor 110. In operation, a preset current 112 flows either into or out of discrete capacitor 110. In particular, when the gates of transistors 104, 106 are asserted low, preset current 112 is sourced to discrete capacitor 110 via transistors 102, 104. Once discrete capacitor 110 is sufficiently charged to trigger a defined level of a Schmidt trigger 120, an output of Schmidt trigger 120 asserts low and in turn an output of a succeeding inverter 130 asserts high. The output of inverter 130 is provide to the gates of transistors 104, 106 such that preset current 112 is discharged from discrete capacitor 110 via transistors 106, 108. Once sufficient charge is removed from discrete capacitor 110 a lower voltage threshold of Schmidt trigger 120 is achieved causing the output of Schmidt trigger 120 to assert high. In turn, the output of inverter 130 is asserted low causing preset current 112 to flow into discrete capacitor 110 via transistors 102, 104. Thus, an oscillation within a particular range defined by preset current 112 and discrete capacitor 110 is achieved.

The actual oscillation frequency is somewhat controlled by an input 160 that is capable of rendering small adjustments in preset current 112 via a current mirror and enable circuit consisting of transistors 173-179 and an inverter 150. Further, a clock output 180 may be provided via an inverting buffer 140. The range over which the oscillation frequency may be adjusted using input 160 is typically limited due to various sources of distortion and the value of discrete capacitor 110. This limits the operational utility of voltage controlled oscillator 100.

Hence, for at least the aforementioned reasons, there exists a need in the art for advanced systems and methods for clock generation.

BRIEF SUMMARY OF THE INVENTION

The present invention is related to systems and methods for synchronizing a semiconductor device, and more particularly to systems and methods for generating a clock signal.

Some embodiments of the present invention provide systems for generating clock signals that include a phase/frequency control circuit that provides a feedback control; a multi-range selector circuit that receives the feedback control; and a controlled oscillator that provides an output with a phase and frequency at least in part governed by the multi-range selector circuit and the feedback control. In some cases of the aforementioned embodiments, the phase/frequency control circuit includes a crystal, a phase frequency detector circuit, and a charge pump. In various instances of the aforementioned embodiments, the controlled oscillator is a ring oscillator relying on inherent capacitance.

In some instances of the aforementioned embodiments, the multi-range selector circuit has one diode connected transistor in parallel with at least one other transistor that is selectably configurable to be another diode connected transistor. Thus, by selectably configuring the other transistor, there are two diode connected transistors in parallel. In various instances, there may be three or more selectably configurable transistors such that three or more diode connected transistors may be formed in parallel. Such an approach effectively increases the area of the combined diode connected transistors such that a current traversing the multi-range selector circuit is modified. This current may be used in part to govern the operation of the controlled oscillator. In some cases, the selectably configurable transistor(s) are electrically coupled to one or more tri-state switches that may be controlled by a selector input.

Other embodiments of the present invention provide methods for generating clock pulses. Such methods include providing a phase/frequency control circuit, a multi-range selector circuit, and a controlled oscillator. In some cases, the multi-range selector circuit includes a diode connected transistor, and the method further includes selectably configuring another transistor as a second diode connected transistor in parallel with the aforementioned diode connected transistor. In particular cases, a tri-state switch is electrically coupled to the selectably configurable transistor, and the method further includes operating the tri-state switch to cause the drain of the selectably configurable transistor to short to the gate of the same transistor.

Yet another particular embodiment of the present invention provides a phase lock loop clock generator. The phase lock loop clock generator includes a reference frequency generator, a phase/frequency control circuit, a multi-range selector circuit, and a controlled oscillator. The phase/frequency control circuit includes a phase frequency detector circuit, and a charge pump. The multi-range selector circuit has a first diode connected transistor in parallel with at least one other transistor selectably configurable to be a second diode connected transistor in parallel with the first diode connected transistor. The controlled oscillator is a ring oscillator relying on inherent capacitance.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference

DETAILED DESCRIPTION OF THE INVENTION

The present invention is related to systems and methods for synchronizing a semiconductor device, and more particularly to systems and methods for generating a clock signal.

Some embodiments of the present invention provide systems and methods for generating clock signals that include a phase/frequency control circuit, a multi-range selector circuit, and a controlled oscillator. As used herein, the phrase "controlled oscillator" is used in its broadest sense to mean any device capable of providing an oscillator based on a particular input control. Thus, for example, a controlled oscillator may be, but is not limited to, a voltage controlled oscillator or a current controlled oscillator. Also, as used herein, the phrase "multi-range selector circuit" is used in its broadest sense to mean a circuit capable of selectably operating across two or more distinct ranges. Further, as used herein, the phrase "phase/frequency detector" is used in its broadest sense to denote any circuit or system that is capable of detecting the phase and/or frequency of a received signal.

In some cases of the aforementioned embodiments, the controlled oscillator is a ring oscillator relying on inherent capacitance. As used herein, the phrase "inherent capacitance" is used specifically to denote capacitance included in one or more non-capacitor elements of a circuit. Thus, a circuit relying on "inherent capacitance" does not rely on a discrete capacitor included in the circuit. In addition, as used herein, the phrase "electrically coupled" is used in its broadest sense to mean any coupling whereby an electrical signal may pass from one element to another. Thus, for example, two elements may be electrically coupled directly via a wire or indirectly via another device. Based on the disclosure provided herein, one of ordinary skill in the art will recognize a variety of other couplings that are included within the phrase electrically coupled.

Figure 1:
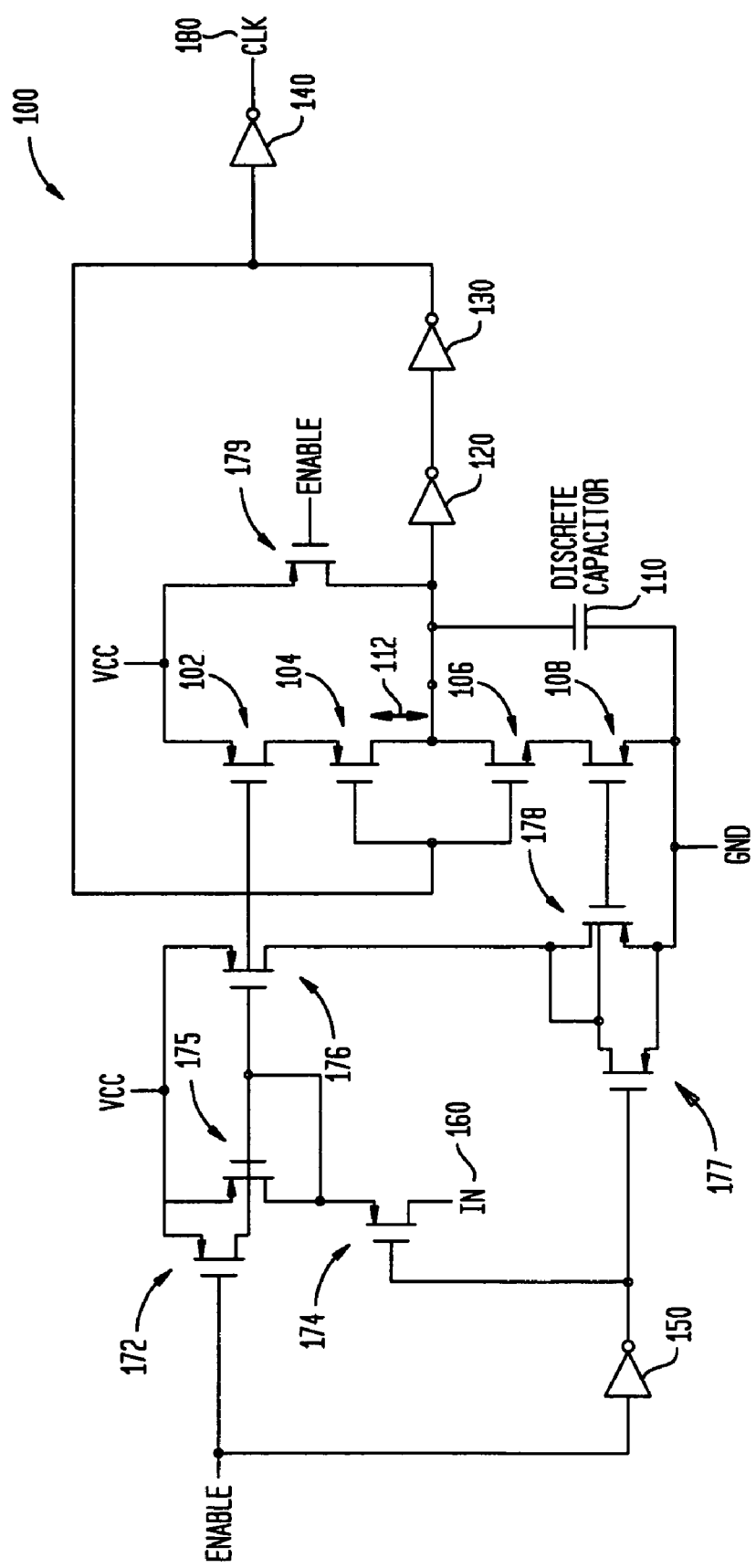
FIG. 1 depicts a known voltage controlled oscillator.
Figure 2:
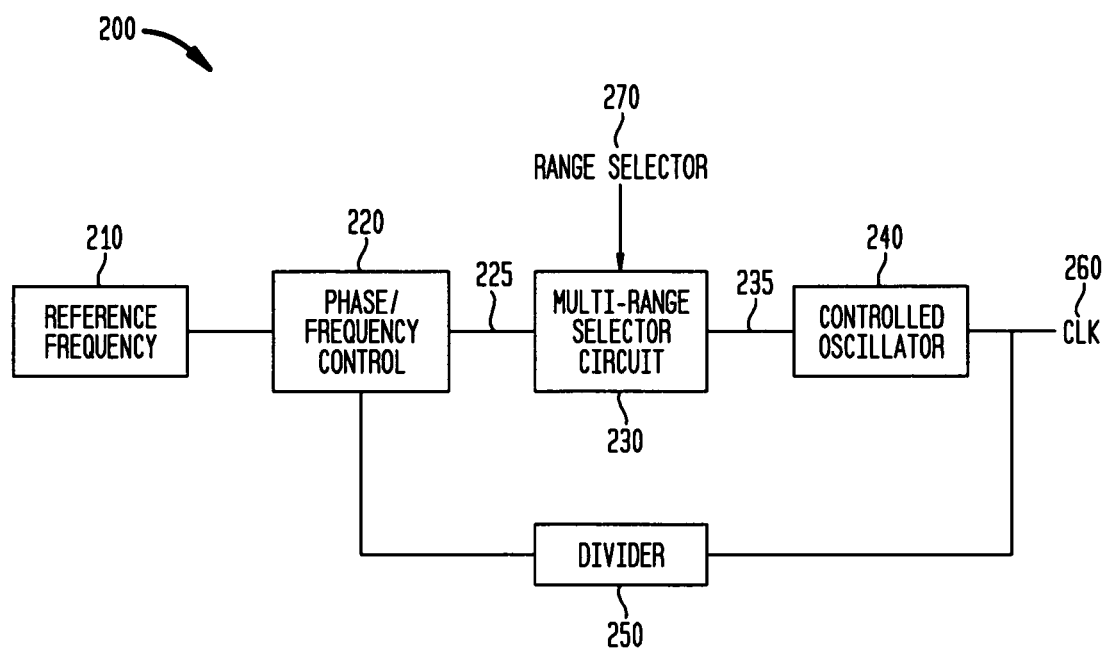
FIG. 2 depicts a phase lock loop system in accordance with one or more embodiments of the present invention.

Turning to FIG. 2, a phase lock loop system 200 including a multi-range range selector circuit 230 in accordance with one or more embodiments of the present invention is depicted. In particular, phase lock loop system 200 includes a reference frequency 210, a phase/frequency control 220, multi-range selector circuit 230, a controlled oscillator 240, and a divider 250. Reference frequency 210 may be any circuit, device or input that provides a reference frequency. In some embodiments, reference frequency 210 is a crystal that oscillates at a predictable frequency under defined conditions. Based on the disclosure provided herein, one of ordinary skill in the art will recognize a variety of circuits, devices or inputs that may be used to perform the function of reference frequency 210.

Phase/frequency control 220 may be any circuit capable of detecting a difference in phase and/or frequency between the output of reference frequency 210 and a derivative of a clock 260 output from phase lock loop system. Phase/frequency control 220 is also responsible for providing a feedback output 225 designed to adjust the operation of controlled oscillator to reduce or eliminate any difference in phase and/or frequency.

Multi-range selector circuit 230 provides an ability to operate phase lock loop system 200 over a broad operational range. In one particular embodiment of the present invention, multi-range selector circuit 230 provides for operation extending across two or more frequency ranges depending upon the assertion level of a range selector input 270. In some embodiments of the present invention, multi-range selector circuit 230 is operable to modify the feedback output 225 depending upon the particular range of operation that is selected. In one particular embodiment of the present invention, multi-range selector circuit 230 includes a number of parallel current paths that may be selected depending upon range selector 270, and which have an impact on a range output 235 provided by multi-range selector circuit 230 to controlled oscillator 240.

Controlled oscillator 240 provides a clock output 260 at a particular phase and frequency as directed by feedback output 225 and range output 235. In one particular embodiment of the present invention, controlled oscillator 240 is a voltage controlled oscillator implemented using a ring oscillator without using a discrete capacitor. In such embodiments, the ring oscillator relies on capacitance inherent in one or more devices incorporated in the ring oscillator. While the aforementioned approach includes novel features, it will be noticed by one of ordinary skill in the art that other controlled oscillators may be used in relation to other embodiments of the present invention. As just one example, a current controlled oscillator may be implemented. As another example, an oscillator relying on a discrete capacitor may be used.

Figure 3:
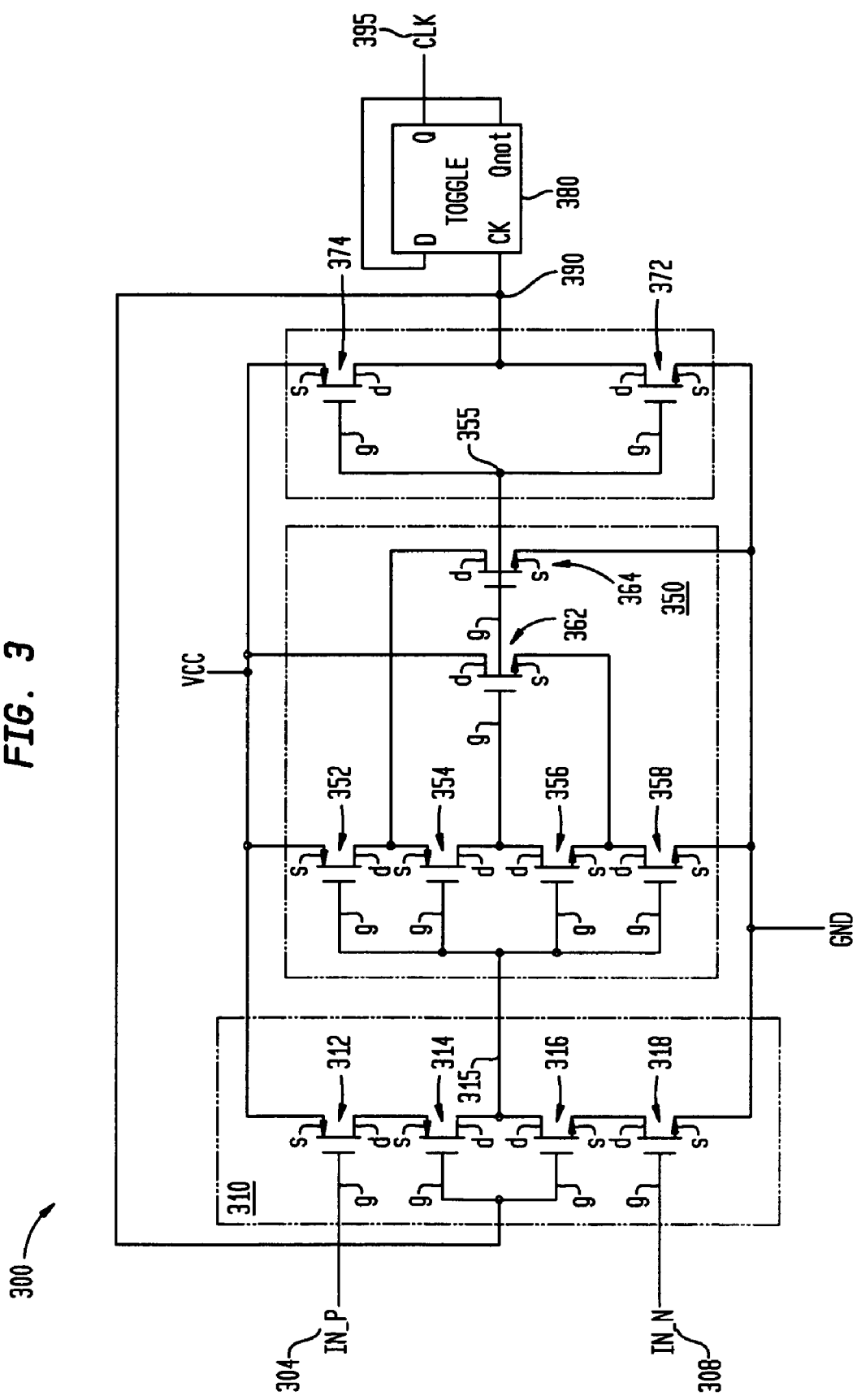
FIG. 3 depicts a controlled oscillator in accordance with various embodiments of the present invention.

Turning to FIG. 3, a voltage controlled oscillator 300 in accordance with one or more embodiments of the present invention is depicted. Voltage controlled oscillator 300 includes a positive input 304 and a negative input 308 driving a current controller stage 310. In addition, voltage controlled oscillator 300 includes a threshold detecting switch 350, an inverter stage 370, and a D-flip-flop 380 configured to toggle. It should be noted that voltage controlled oscillator 300 may be used in place of controlled oscillator 240 for particular implementations of the present invention.

Current controller stage 310 includes two PFET transistors 312, 314 and two NFET transistors 316, 318. Each of transistors 312, 314, 316, 318 include a source (marked 's'), a drain (marked 'd'), and a gate (marked 'g'). In particular, the source of transistor 312 is electrically coupled to a power supply (Vcc). The gate of transistor 312 is electrically coupled by positive input 304, and the drain of transistor 312 is electrically coupled to the source of transistor 314. The gate of transistor 314 is electrically coupled to the gate of transistor 316 and to a feedback node 390. The drain of transistor 314 is electrically coupled to the drain of transistor 316, and the source of transistor 316 is electrically coupled to the drain of transistor 318. The gate of transistor 318 is electrically coupled to negative input 308, and the source of transistor 318 is electrically coupled to ground.

Threshold detecting switch 350 includes three PFET transistors 352, 354, 364 and three NFET transistors 356, 358, 362. Each of transistors 352, 354, 356, 358, 362, 364 include a source (marked 's'), a drain (marked 'd'), and a gate (marked 'g'). In particular, the source of transistor 352 is electrically coupled to Vcc. The gate of each of transistors 352, 354, 356, 358 are electrically coupled to the drains of transistors 314, 316. The drain of transistor 352 is electrically coupled to the source of transistor 354, the drain of transistor 354 is electrically coupled to the drain of transistor 356, the source of transistor 356 is electrically coupled to the drain of transistor 358, and the source of transistor 358 is electrically coupled to ground. The gate of transistor 362 is electrically coupled to the drains of transistors 354, 356, and to the gate of transistor 364. The source of transistor 362 is electrically coupled to the source of transistor 356, and the source of transistor 364 is electrically coupled to the source of transistor 354. The drain of transistor 362 is electrically coupled to Vcc, and the drain of transistor 364 is electrically coupled to ground.

Inverter stage 370 includes an NFET transistor 372 and a PFET transistor 374. In particular, the source of transistor 374 is electrically coupled to Vcc, and the drain of transistor 374 is electrically coupled to the drain of transistor 372 and to feedback node 390. The gates of transistors 372, 374 are electrically coupled together and to the gates of transistors 362, 364. The source of transistor 372 is electrically coupled to ground. Feedback node 390 is additionally coupled to the clock input of D flip-flop 380. The Q output of D flip-flop 380 provides a clock output.

In operation, current controller stage 310 controls the frequency of oscillation by controlling the current sourced and sinked to the rest of the circuit. In particular, current is sourced via transistors 312, 314 and sinked via transistors 316, 318 depending upon the voltage present at positive input 304, negative input 308, and the voltage at feedback node 390. Current sourced and sinked by current controller stage 310 is provided to an inherent capacitance (i.e., the capacitance evident in other transistors of voltage controlled oscillator 300, and the combination of the current and the inherent capacitance govern the frequency of oscillation noted at a node 315.

Threshold detecting switch 350 receives the voltage evident at node 315 and, once a first threshold has been achieved, it switches to a particular assertion level (i.e., high or low). Then, once a second threshold is achieved, it switches to the opposite threshold. Thus, threshold detecting switch provides functionality similar to a schmidt trigger with a turn on threshold and a turn off threshold. In one particular embodiment of the present invention, the turn on threshold (i.e., the threshold achieved before switching from low to high) is four hundred millivolts, and the turn off threshold (i.e., the threshold achieved before switching from high to low) is six hundred millivolts. By using a circuit such a threshold detecting switch 350, the voltage at a node 315 is ensured of never becoming excessively small.

As an example, when feedback node 390 is asserted low and positive input 304 is low, the voltage at a node 315 is high and current is sourced to charge the inherent capacitance of voltage controlled oscillator 300. In this condition, the voltage at node 315 is increasing as the inherent capacitance charges. Once the voltage at node 315 exceeds the turn on threshold of threshold detecting switch 350, threshold detecting switch 350 switches such that the voltage at a node 355 changes from high to low. This change from high to low is reflected as a change from low to high at feedback node 390.

As the voltage at feedback node 390 switches from low to high and negative input 308 is asserted high, current is sinked via transistors 316, 318 causing the inherent capacitance of voltage controlled oscillator 300 to discharge. As the inherent capacitance is discharged, the voltage at node 315 decreases. Once the voltage at node 315 decreases past the turn off threshold of threshold detecting switch 350, threshold detecting switch 350 switches such that the voltage at a node 355 changes from low to high. This change from low to high is reflected as a change from high to low at feedback node 390.

Thus, feedback node 390 oscillates at a frequency governed by positive input 304, negative input 308, and the inherent capacitance of voltage controlled oscillator 300. In some cases, feedback node 390 dives the clock input of D flip-flop 380. D flip-flop 380 is configured to toggle such that clock output 395 oscillates at one half the rate of feedback node 390, but with a near fifty percent duty cycle. Where duty cycle is not critical, D flip-flop 380 may be eliminated.

Figure 4:
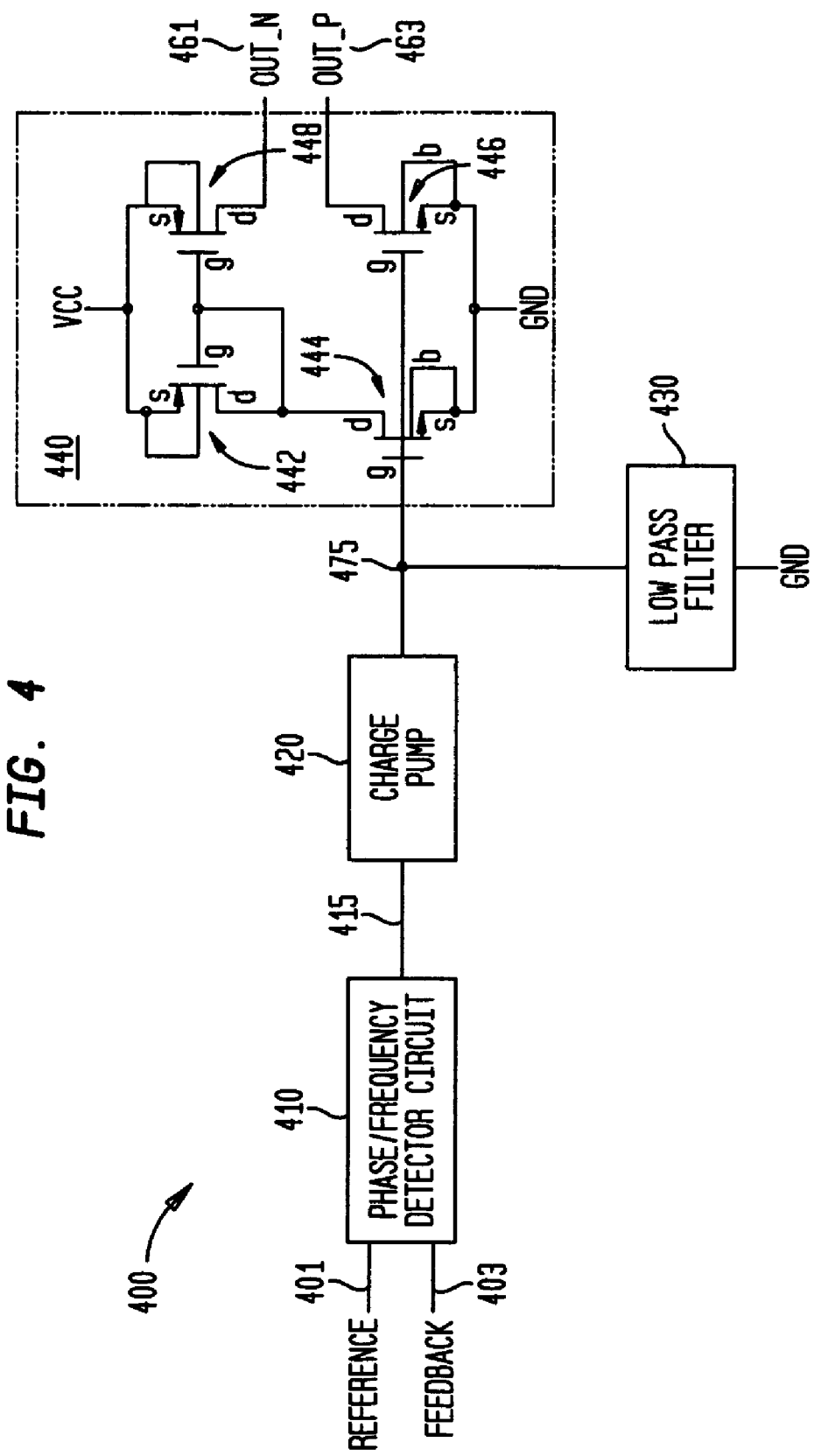
FIG. 4 illustrates a phase/frequency control circuit in accordance with some embodiments of the present invention.

Turning to FIG. 4, a phase/frequency control circuit 400 that may be used in accordance with various embodiments of the present invention is depicted. Phase/frequency control circuit 400 is operable to a difference in phase and/or frequency between a feedback frequency 403 and a reference frequency 401. In addition, phase/frequency control circuit 400 is responsible for providing a positive feedback output 463 and a negative feedback output 461 designed to adjust the operation of downstream controlled oscillator such that the feedback frequency is driven to the same phase and frequency of the reference frequency.

Phase/frequency control circuit includes a phase/frequency detector circuit 410 that receives a reference frequency 401 and a feedback frequency 403. Phase frequency detector circuit 410 constantly compares the phase and frequency of reference frequency 401 and feedback frequency 403, and provides an output 415 representing the difference between the aforementioned frequencies. Phase/frequency detector circuit may be any phase/frequency comparison circuit known in the art.

Output 415 is provided to a charge pump 420 that is responsible for creating a feedback voltage at a node 475. Charge pump 420 may be any charge pump known in the art. Node 475 is electrically coupled to a low pass filter capable of reducing noise at a particular frequency from the voltage evident at node 475. Low pass filter 475 may be an RC circuit as is none in the art, or other circuit known in the art that is tuned for a desired frequency range.

The feedback voltage at node 475 drives a current mirror circuit 440. In particular, node 475 is electrically coupled to the gate of a transistor 444 and to the gate of a transistor 446. The drain of transistor 444 is electrically coupled to the source of a transistor 442, and the source of transistor 444 is electrically coupled to ground. The drain of transistor 446 is electrically coupled to positive output 463, and the source of transistor 446 is electrically coupled to ground. The gate of transistor 442 is electrically coupled to the gate of a transistor 448, and the sources of transistors 442, 448 are each electrically coupled to Vcc. The gates of both transistors 442, 448 are electrically coupled to the drain of transistor 444. The drain of transistor 448 is electrically coupled to negative output 461. Each of transistors 442, 444, 446, 448 are self tubbed with the body of the respective transistor electrically coupled to the source thereof.

In operation, when the voltage at node 475 increases, transistors 444, 446 turn on causing positive output 463 to assert low. When the voltage at node 475 decreases, transistors 444, 446 turn off, and transistors 442, 448 turn on causing negative output 461 to assert high.

Figure 5:
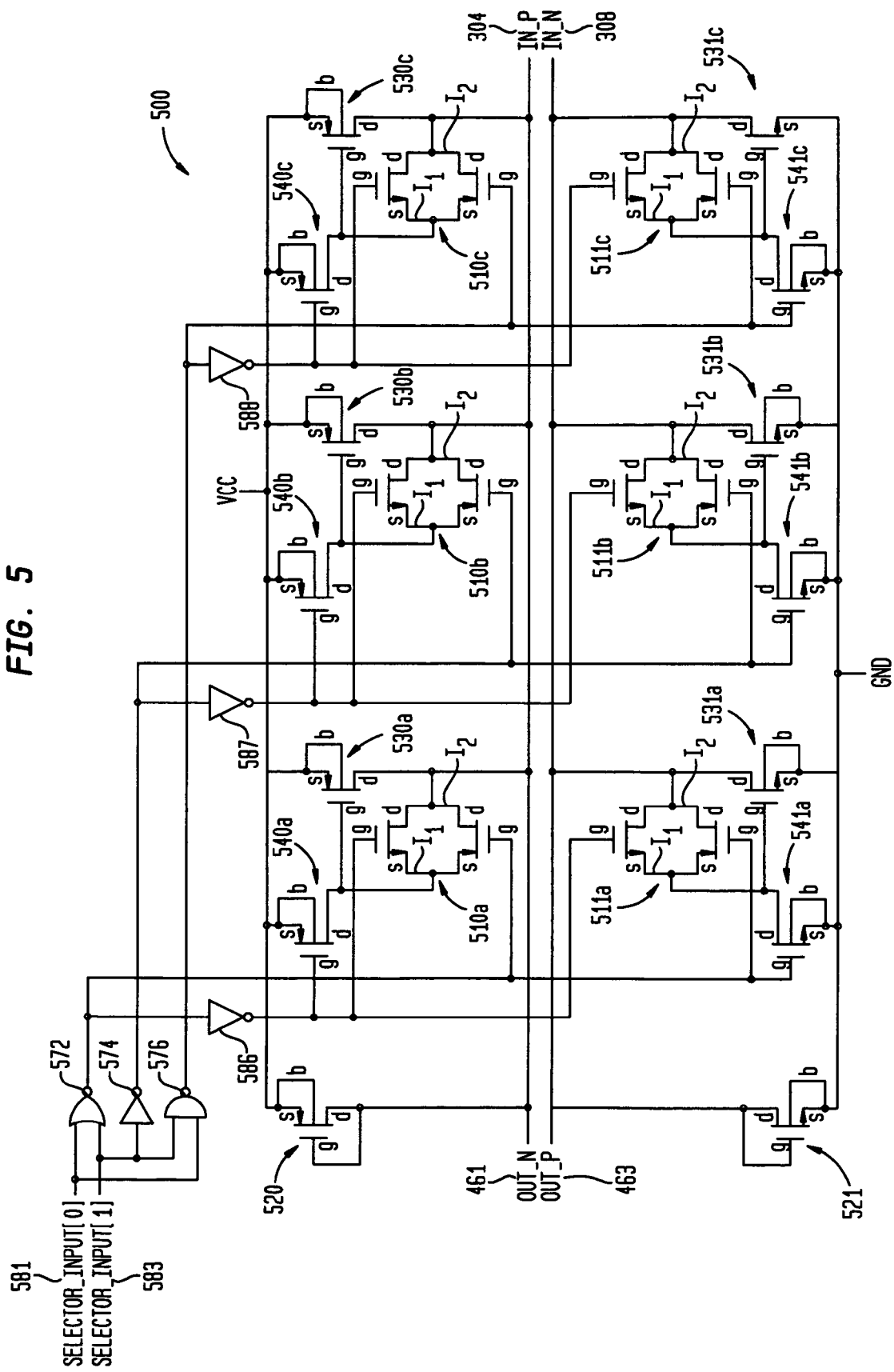
FIG. 5 is a schematic diagram of a multi-range selector circuit in accordance with one or more embodiments of the present invention.

Turning to FIG. 5, a multi-range selector circuit in accordance with one or more embodiments of the present invention is shown. Multi-range selector circuit 500 includes a path of two diode connected transistors 520, 521 in parallel with three paths with transistors 530, 531 that are selectably configurable to be diode connected transistors using respective transistors 540, 541 and tri-state switches 510, 511. Multi-range selector circuit 500 operates by changing the effective width of diodes 520, 521 by selectably placing other diode connected transistors in parallel with them. Such an approach modifies the amount of current provided to the downstream controlled oscillator via positive input 304 and a negative input 308.

In particular, diode connected transistor 520 is self tubbed with its body connected to the source thereof. In addition, the source of transistor 520 is electrically coupled to Vcc, the gate and the drain of transistor 520 are electrically coupled to negative output 461 and positive input 304. Diode connected transistor 521 is also self tubbed with its body electrically coupled to the source thereof. In addition, the source of transistor 521 is electrically coupled to ground, the gate and the drain of transistor 521 are electrically coupled to positive output 463 and negative input 308.

Each of the three selectably configurable diode connected transistor paths are similarly connected except that the control for each of the paths is different. In particular, transistors 540 are self tubbed with the respective bodies electrically coupled to the respective sources. In addition, the sources of transistors 540 are electrically coupled to Vcc, the respective gates of transistors 540 are electrically coupled to negative output 461 and positive input 304. The respective drains of transistors 540 are electrically coupled to the respective gates of transistors 530, and to a first input (I1) of each of tri-state switches 510. Transistors 530 are also self tubbed with the respective bodies electrically coupled to the respective sources. The sources of transistors 530 are also electrically coupled to Vcc, and the drains of transistors 530 are electrically coupled to a second input (I2) each of tri-state switches 510, and to negative output 461 and positive input 304. Each of tri-state switches 510 include an NFET transistor electrically coupled to a PFET transistor with the sources electrically coupled to each other and the drains electrically coupled to each other.

Transistors 541 are self tubbed with the respective bodies electrically coupled to the respective sources. In addition, the sources of transistors 541 are electrically coupled to ground, the respective gates of transistors 541 are electrically coupled to positive output 463 and negative input 308. The respective drains of transistors 541 are electrically coupled to the respective gates of transistors 531, and to a first input (I1) of each of tri-state switches 510. Transistors 531 are also self tubbed with the respective bodies electrically coupled to the respective sources. The sources of transistors 531 are also electrically coupled to ground, and the drains of transistors 531 are electrically coupled to a second input (I2) each of tri-state switches 511, and to positive output 463 and negative input 308. Each of tri-state switches 511 include an NFET transistor electrically coupled to a PFET transistor with the sources electrically coupled to each other and the drains electrically coupled to each other. In operation, a selector input 581 and a selector input 583 are applied to combinatorial logic including a NOR gate 572, a NAND gate 576, and inverters 574, 586, 587, 588. The assertion level of selector input 581 and selector input 583 control tri-state switches 510, 511 such that transistors 530, 531 are selectably configured as diode connected transistors. For example, for one value of selector inputs 581, 583, the gates of tri-state switches 510, 511 are asserted such that the NFET transistors and PFET transistors of tri-state switches 510, 511 are open. In such a condition, transistors 530, 531 are not configured as diode connected transistors. For another value of selector inputs 581, 583, the gates of tri-state switches 510, 511 are asserted such that the NFET transistors and PFET transistors of tri-state switches 510, 511 are closed. In such a condition, the input nodes (I1, I2) are shorted together. This results in configuration of transistors 530, 531 as diode connected transistors in parallel with diode connected transistors 520, 521. In particular, the gate of transistor 530 is electrically coupled to the drain of transistor 530 via tri-state switch 510, and the gate of transistor 531 is electrically coupled to the drain 531 via tri-state switch 511.

As previously discussed in relation to FIG. 3, the amount of current available to voltage controlled oscillator 300 directly affects the frequency of oscillation as it modifies the rate of charging and discharging of the inherent capacitance of the circuit. Thus, by providing a path of diode connected transistors in parallel that is selectably configurable to be in parallel with three other diode connected transistors, four distinct operational ranges for voltage controlled oscillator 300 are provided via multi-range selector circuit 500.

In one particular embodiment of the present invention, when the three selectably configurable paths are all configured as parallel diodes, voltage controlled oscillator 300 operates in a range between one hundred MegaHertz and two hundred MegaHertz. When only two of the three paths are configured as parallel diodes, voltage controlled oscillator 300 operates in a range between two hundred MegaHertz and four hundred MegaHertz. When only one of the paths is configured as a parallel diode, voltage controlled oscillator 300 operates in a range between four hundred MegaHertz and eight hundred MegaHertz. When none of the three paths are configured as parallel diodes, voltage controlled oscillator 300 operates in a range between eight hundred MegaHertz and sixteen hundred MegaHertz. Based on the disclosure provided herein, one of ordinary skill in the art will recognize that more or fewer than three selectably configurable parallel diodes to provide for more or fewer operational ranges. Further, based on the disclosure provided herein, one of ordinary skill in the art will recognize that the preceding specific operational ranges are merely exemplary, and that other operational ranges are possible depending upon the design of charge pump 420, multi-range selector 500, and voltage controlled oscillator 300.

Use of such a multi-range selector circuit offers one or more advantages such as, for example, enabling a more linear gain as a function of frequency. Alternatively, or in addition, use of such a multi-range selector circuit constrains control noise and/or reduces nose from filters at higher voltage controlled oscillator frequencies. Based on the disclosure provided herein, one of ordinary skill in the art will recognize various other advantages that may be achieved using systems and methods in accordance with one or more embodiments of the present invention. In one particular case, the range of operation is statically selected by an end user based on a desired frequency range. However, based on the disclosure provided herein, one of ordinary skill in the art will recognize other dynamic and static approaches to using the range selection of various embodiments of the present invention.

In conclusion, the present invention provides novel systems and methods for clock generation. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A system for generating clock pulses, the system comprising:
   a phase/frequency control circuit, wherein the phase frequency control circuit provides a feedback control;
   a defined current path, wherein the defined current path includes a first diode connected transistor;

a multi-range selector circuit including a plurality of current paths in parallel with the defined current path, wherein selection of a subset of the plurality of current paths is based at least in part on the feedback control, wherein selection of a first subset of the plurality of current paths yields a control output exhibiting a first current corresponding to a first frequency range, wherein selection of a second subset of the plurality of current paths yields the control output exhibiting a second current corresponding to a second frequency range, wherein the first frequency range differs from the second frequency range, and wherein the multi-range selector circuit has at least one other transistor selectably configurable to be a second diode connected transistor in parallel with the first diode connected transistor;

a controlled oscillator, wherein the controlled oscillator provides an output with a phase and frequency at least in part governed by the control output; and wherein the system for generating clock pulses is capable of locking to a frequency within the first frequency range when the control output exhibits the first current, and wherein the system for generating clock pulses is capable of locking to a frequency within the second frequency range when the control output exhibits the second current.

2. The system of claim 1, wherein the phase/frequency control circuit includes:

a crystal;

a phase frequency detector circuit; and a charge pump.

3. The system of claim 1, wherein the multi-range selector circuit further includes another transistor selectably configurable to be a third diode connected transistor in parallel with the first diode connected transistor and the second diode connected transistor.

4. The system of claim 1, wherein the multi-range selector circuit further includes a selector input, wherein the selector input is operable to selectably configure the other transistor as the second diode connected transistor.

5. The system of claim 1, wherein the other transistor is electrically coupled to a tri-state switch.

6. The system of claim 5, wherein the tri-state switch is operable to short the gate of the other transistor to the drain of the other transistor, wherein the other transistor is configured as the second diode connected transistor.

7. The system of claim 5, wherein the tri-state switch includes a PFET transistor and an NFET transistor.

8. The system of claim 1, wherein selectably configuring the other transistor as the second diode connected transistor in parallel with the first diode connected transistor is operable to modify a current of the multi-range selection circuit.

9. The system of claim 8, wherein the current of the multi-range selection circuit at least in part governs a frequency of the controlled oscillator.

10. The system of claim 1, wherein the controlled oscillator is a ring oscillator, and wherein the ring oscillator relies on inherent capacitance.

11. The system of claim 10, wherein the ring oscillator includes a Schmidt trigger.

12. A method for generating clock pulses, the method comprising:

providing a phase/frequency control circuit, wherein the phase frequency control circuit provides a feedback control;

providing a defined current path, wherein the defined current path includes a first diode connected transistor;

providing a multi-range selector circuit including a plurality of current paths each in parallel with the defined current path, wherein selection of a subset of the plurality of current paths is based at least in part on the feedback control, wherein selection of a first subset of the plurality of current paths yields a control output exhibiting a first current corresponding to a first frequency range, wherein selection of a second subset of the plurality of current paths yields the control output exhibiting a second current corresponding to a second frequency range, wherein the first frequency range differs from the second frequency range, and wherein selection of the first subset of the plurality of current paths includes selectably configuring another transistor as a second diode connected transistor in parallel with the first diode connected transistor; and providing a controlled oscillator, wherein the controlled oscillator provides an output with a phase and frequency at least in part governed by the control output.

13. The method of claim 12, wherein selection of the second subset of the plurality of current paths comprises:

selectably configuring another transistor as a third diode connected transistor in parallel with the first diode connected transistor.

14. The method of claim 13, wherein configuring the other transistor as a second diode connected transistor effectively increases a diode width.

15. The method of claim 14, wherein the increase in diode width modifies a current seen by the controlled oscillator.

16. The method of claim 12, wherein the controlled oscillator is a ring oscillator relying on inherent capacitance.

17. The method of claim 12, wherein the plurality of current paths includes a first current path in parallel with a second current path such that current supplied by the first current path is added to current supplied by the second current path.

18. A system for generating clock pulses, the system comprising:

a phase/frequency control circuit, wherein the phase frequency control circuit provides a feedback control;

a multi-range selector circuit having a plurality of current paths, wherein the multi-range selector circuit includes a first diode connected transistor in parallel with at least one other transistor, wherein a gate of the first diode connected transistor is electrically connected to the feedback control, wherein the other transistor is selectably configurable as a second diode connected transistor in parallel with the first diode connected transistor, wherein the first diode connected transistor provides a first current path, wherein the second diode connected transistor provides a second current path, and wherein selection of a subset of the plurality of current paths through control of the other transistor is based at least in part on the feedback control and provides a control output corresponding to a frequency range; and a controlled oscillator, wherein the controlled oscillator provides an output with a phase and frequency at least in part governed by the control output.

19. The system of claim 18, wherein the second diode connected transistor is associated with one of the plurality of current paths.

20. A system for generating clock pulses, the system comprising:

a multi-range selector circuit, including a plurality of current paths, wherein the multi-range selector circuit has a first diode connected transistor in parallel with at least one other transistor, wherein a gate of the first diode connected transistor is electrically coupled to a feedback control, and wherein selection of a subset of the plurality of current paths is based at least in part on a feedback control, and includes selectably configuring the other transistor to be a second diode connected transistor in parallel with the first diode connected transistor to yield a control output.

21. The system of claim 20, wherein the system further comprises:
- a phase/frequency control circuit, wherein the phase frequency control circuit provides the feedback control; and
- a controlled oscillator, wherein the controlled oscillator provides an output with a phase and frequency at least in part governed by the control output.

22. The system of claim 21, wherein the first diode connected transistor is associated with a first of the plurality of current paths in parallel with a second of the plurality of current paths associated with the second diode connected transistor such that current supplied by the first current path is added to current supplied by the second current path.

23. The system of claim 22, wherein the control output includes an output current including a first current from the first current path and a second current from the second current path.

* * * * *